(12) United States Patent
Tsai et al.

(10) Patent No.: US 11,063,011 B1
(45) Date of Patent: Jul. 13, 2021

(54) CHIP AND WAFER HAVING MULTI-LAYERED PAD

(71) Applicant: NANYA TECHNOLOGY CORPORATION, New Taipei (TW)

(72) Inventors: Chia-Lin Tsai, Chiayi (TW); Mao-Ying Wang, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/796,904

(22) Filed: Feb. 20, 2020

(51) Int. Cl.
*H01L 23/00* (2006.01)

(52) U.S. Cl.
CPC ............. *H01L 24/13* (2013.01); *H01L 24/05* (2013.01); *H01L 2224/02181* (2013.01); *H01L 2224/0401* (2013.01); *H01L 2224/13019* (2013.01); *H01L 2224/13083* (2013.01); *H01L 2224/13144* (2013.01); *H01L 2224/13147* (2013.01); *H01L 2224/13155* (2013.01)

(58) Field of Classification Search
CPC ...................... H01L 24/13; H01L 24/05; H01L 2224/02181; H01L 2224/0401; H01L 2224/13019; H01L 2224/13083; H01L 2224/13144; H01L 2224/13147; H01L 2224/13155
See application file for complete search history.

(56) References Cited

U.S. PATENT DOCUMENTS

| | | | | |
|---|---|---|---|---|
| 9,559,075 | B1* | 1/2017 | Baloglu | H01L 24/05 |
| 2010/0244241 | A1* | 9/2010 | Marimuthu | H01L 25/0657 257/737 |
| 2014/0319695 | A1* | 10/2014 | Hsieh | H01L 23/562 257/774 |
| 2015/0340328 | A1* | 11/2015 | Gandhi | H01L 24/11 257/762 |
| 2018/0090459 | A1* | 3/2018 | Kim | H01L 24/83 |
| 2021/0020584 | A1* | 1/2021 | Yu | H01L 21/561 |

FOREIGN PATENT DOCUMENTS

TW 201937605 A 9/2019

* cited by examiner

*Primary Examiner* — Douglas W Owens
(74) *Attorney, Agent, or Firm* — CKC & Partners Co., LLC

(57) ABSTRACT

A chip includes pads having first connecting surfaces, and conductive structures located on the first connecting surfaces. The conductive structures are disposed on the first connecting surfaces. Each of the conductive structures includes first metal layer, second metal layer, and third metal layer. The first metal layer connects one of the pads, and the second metal layer is disposed between the first metal layer and the third metal layer. On every pad, the first metal layer, the second metal layer, and the third metal layer are stacked along first direction on the first connecting surface of the pad, and the first direction is parallel to normal direction of the first connecting surface, and the first metal layer is made of material comprising gold, and the second metal layer is made of material comprising nickel. A wafer is also provided.

14 Claims, 7 Drawing Sheets

CHIP AND WAFER HAVING MULTI-LAYERED PAD

BACKGROUND

Field of Disclosure

The present disclosure relates to chip and wafer. More particularly, the present disclosure relates to chip and wafer with high durability.

Description of Related Art

During a manufacture of integrated circuits, a testing and validation of the circuits at a wafer level is required, before the circuits on a wafer are diced and packaged. A probe card electrically connected to a tester can test the circuits on the wafer, and the tester will be calibrated with a correlation wafer.

However, after calibrating a plurality of testers, the correlation wafer may be worn out or scraped after 5, 10, or 20 times of testing in the testers, and one cannot tell if a failure is due to the testers or the correlation wafer integrity, and replacing the correlation wafer also increase the labor time and cost of the manufacture.

SUMMARY

The present disclosure relates in general to a chip and a wafer.

According to an embodiment of the present disclosure, a chip includes pads having first connecting surfaces respectively, and conductive structures located on the first connecting surfaces respectively. The conductive structures are disposed on the first connecting surfaces respectively. Each of the conductive structures includes a first metal layer, a second metal layer, and a third metal layer. The first metal layer connects one of the pads, and the second metal layer is disposed between the first metal layer and the third metal layer. On every pad, the first metal layer, the second metal layer, and the third metal layer are stacked along a first direction on the first connecting surface of the pad, and the first direction is parallel to a normal direction of the first connecting surface, and the first metal layer is made of a material comprising gold, and the second metal layer is made of a material comprising nickel.

In an embodiment of the present disclosure, each of the conductive structures includes a depression corresponded to the first connecting surface covered by the conductive structure, and, on the first direction, a depth of the depression is less than 2 micrometer.

In an embodiment of the present disclosure, each of the conductive structures includes a second connecting surface located on the third metal layer. The second connecting surface includes an inner edge and an outer edge, and the inner edge of the second connecting surface is facing toward a center of the chip, and the outer edge of the second connecting surface is facing toward an edge of the chip. A first distance is between the inner edge and the depression, and a second distance is between the outer edge and the depression. The ratio of the first distance to the second distance falls in a range from 2:77 to 10:35.

In an embodiment of the present disclosure, each of the conductive structures comprises a second connecting surface located on the third metal layer, and the second connecting surface comprises an inner edge, a first connecting area, a second connecting area, and an outer edge, and the inner edge of the second connecting surface is facing toward a center of the chip, and the outer edge of the second connecting surface is facing toward an edge of the chip, and the first connecting area is disposed between the depression and the second connecting area, and the second connecting area is disposed between the first connecting area and the outer edge, and, on a direction facing toward the edge of the chip, a width of the first connecting area is larger than 35 micrometer, and a width of the second connecting area is layer than 35 micrometer.

In an embodiment of the present disclosure, each of the conductive structures includes a second connecting surface located on the third metal layer. An area of the second connecting surface is larger than an area of the first connecting surface of the pad, which is disposed below the conductive structure.

In an embodiment of the disclosure, the chip further comprises a passivation layer, a first polyimide layer, and a second polyimide layer. The passivation layer is disposed between the conductive structures and the pads. The first polyimide is disposed between the passivation layer and the conductive structures. The second polyimide layer is disposed on the conductive structures. The passivation layer includes pad openings, and the pad openings are corresponded to the first connecting surfaces of the pads respectively. The first polyimide layer includes a plurality of first openings, and each of the first openings is located above one of the pad openings. The second polyimide layer includes a plurality of second openings, and each of the second openings is corresponded to one of the conductive structures.

In an embodiment of the disclosure, the first metal layer is made of a material comprising copper.

In an embodiment of the disclosure, on the first direction, a thickness of the first metal layer is larger than a thickness of the second metal layer, and the thickness of the second metal layer is larger than a thickness of the third metal layer.

According to an embodiment of the present disclosure, a wafer includes a plurality of chips. Each of the chips includes pads having first connecting surfaces, and conductive structures being disposed on the first connecting surfaces respectively. In every chip, each of the conductive structures includes a first metal layer connecting one of the pads, a third metal layer, and a second metal layer being disposed between the first metal layer and the third metal layer. On every pad, the first metal layer, the second metal layer, and the third metal layer are stacked along a first direction on the first connecting surface of the pad, and the first direction is parallel to a normal direction of the first connecting surface. The first metal layer is made of a material comprising gold, and the second metal layer is made of a material comprising nickel.

In an embodiment of the present disclosure, each of the conductive structures includes a depression corresponded to the first connecting surface covered by the conductive structures, and, on the first direction, a depth of the depression is less than 2 micrometer.

In an embodiment of the present disclosure, each of the conductive structures includes a second connecting surface located on the third metal layer. The second connecting surface includes an inner edge and an outer edge, and, in every chip, the inner edge of the second connecting surface of every conductive structure is facing toward a center of the chip, and the outer edge of the second connecting surface is facing toward an edge of the chip. A first distance is between the inner edge and the depression, and a second distance is between the outer edge and the depression, and the ratio of the first distance to the second distance falls in a range from 2:77 to 10:35.

In an embodiment of the present disclosure, each of the conductive structures comprises a second connecting surface located on the third metal layer, and the second connecting surface comprises an inner edge, a first connecting area, a second connecting area, and an outer edge, and the inner edge of the second connecting surface is facing toward a center of the chip, and the outer edge of the second connecting surface is facing toward an edge of the chip, and the first connecting area is disposed between the depression and the second connecting area, and the second connecting area is disposed between the first connecting area and the outer edge, and, on a direction facing toward the edge of the chip, a width of the first connecting area is larger than 35 micrometer, and a width of the second connecting area is layer than 35 micrometer.

In an embodiment of the present disclosure, each of the conducive structures includes a second connecting surface located on the third metal layer. An area of the second connecting surface is larger than an area of the first connecting surface of the pad, which is disposed below the conductive structure.

In an embodiment of the present disclosure, each of the chips further includes a passivation layer, a first polyimide layer, and a second polyimide layer. The passivation layer is disposed between the conductive structures and the pads, and the first polyimide layer is disposed between the passivation layer and the conductive structures, and the second polyimide layer is disposed on the conductive structures. The passivation layer includes a plurality of pad openings, and the pad openings are corresponded to the first connecting surfaces of the pads respectively. The first polyimide layer includes a plurality of first openings, and each of the first openings is located above one of the pad openings. The second polyimide layer includes a plurality of second openings, and each of the second openings is corresponded to one of the conductive structures.

In an embodiment of the present disclosure, the first metal layer is made of a material comprising copper.

In an embodiment of the present disclosure, in each of the chips, on the first direction, a thickness of the first metal layer is larger than a thickness of the second metal layer, and the thickness of the second metal layer is larger than a thickness of the third metal layer.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
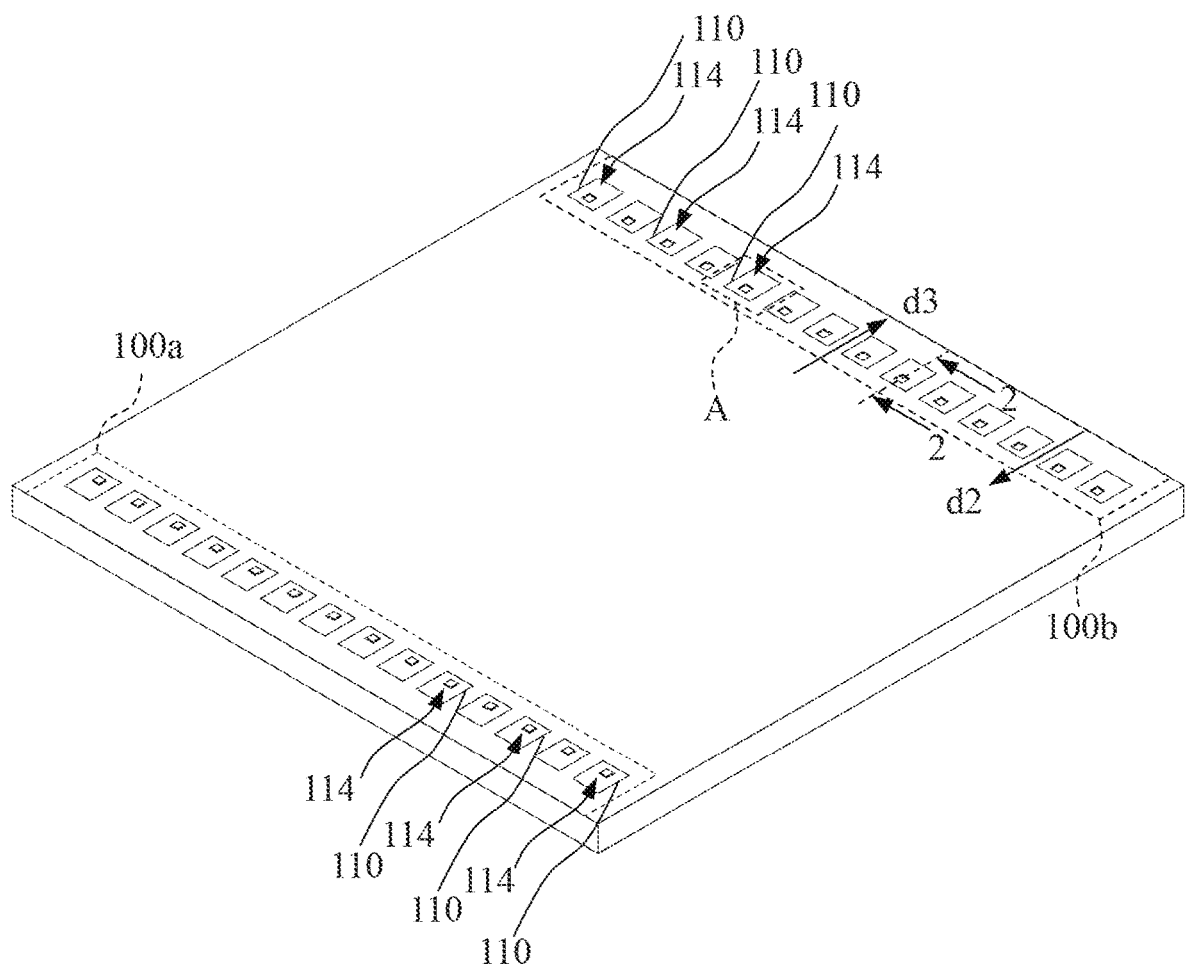
FIG. 1 is a schematic perspective view of a chip of an embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts.

The present disclosure relates to an improvement in chip and wafer including chips. The following description is presented to enable one of ordinary skill in the art to make and use the disclosure as provided in the context of a particular application and its requirements. Various modifications to the preferred embodiment will be apparent to those with skill in the art, and the general principles defined herein may be applied to other embodiments. Therefore, the present disclosure is not intended to be limited to the particular embodiments shown and described, but is to be accorded the widest scope consistent with the principles and novel features herein disclosed.

In the figures, the thickness of layers, films, panels, regions, etc., are exaggerated for clarity. Throughout the specification, the same reference numerals denote the same component. It will be understood that when a component such as a layer, a film, a region or a substrate is referred to as "on" or "connected to" another component, intermediate components can also be present. In contrast, when a component is referred to as "directly on" or "directly connected to" another component, no intermediate component can be present. As used herein, "connected" may refer to both physical and/or electrical connections. Furthermore, "electrical connection" or "coupled" may be the presence of other components between two elements.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Reference will now be made in detail to the present embodiments of the disclosure, examples of which are illustrated in the accompanying drawings. Wherever possible, the same reference numbers are used in the drawings and the description to refer to the same or like parts.

The terms "forming," "form," "deposit," or "dispose" are used herein to describe the act of applying a layer of material to another layer. Such terms are meant to describe any possible layer-forming technique including, but not limited to, thermal growth, sputtering, evaporation, chemical vapor deposition, epitaxial growth, electroplating, etc. According to various embodiments, for instance, deposition may be performed according to any appropriate well-known method. For instance, deposition can comprise any process that grows, coats, or transfers material onto a layer. Some well-known technologies include physical vapor deposition (PVD), chemical vapor deposition (CVD), electrochemical deposition (ECD), molecular beam epitaxy (MBE), atomic layer deposition (ALD), and plasma-enhanced CVD (PECVD).

FIG. 1 is a schematic perspective view of a chip of an embodiment of the present disclosure. Referring to FIG. 1, the chip 100 of the embodiment includes a plurality of conductive structures 110. For example, the conductive structures 110 are disposed on a peripheral area 100a or a peripheral area 100b which is disposed on the opposite side of the chip 100, but the disclosure is not limited thereto. In some embodiment, the conductive structures 110 can further be disposed on the rest of the peripheral area on the chip 100.

Figure 2:
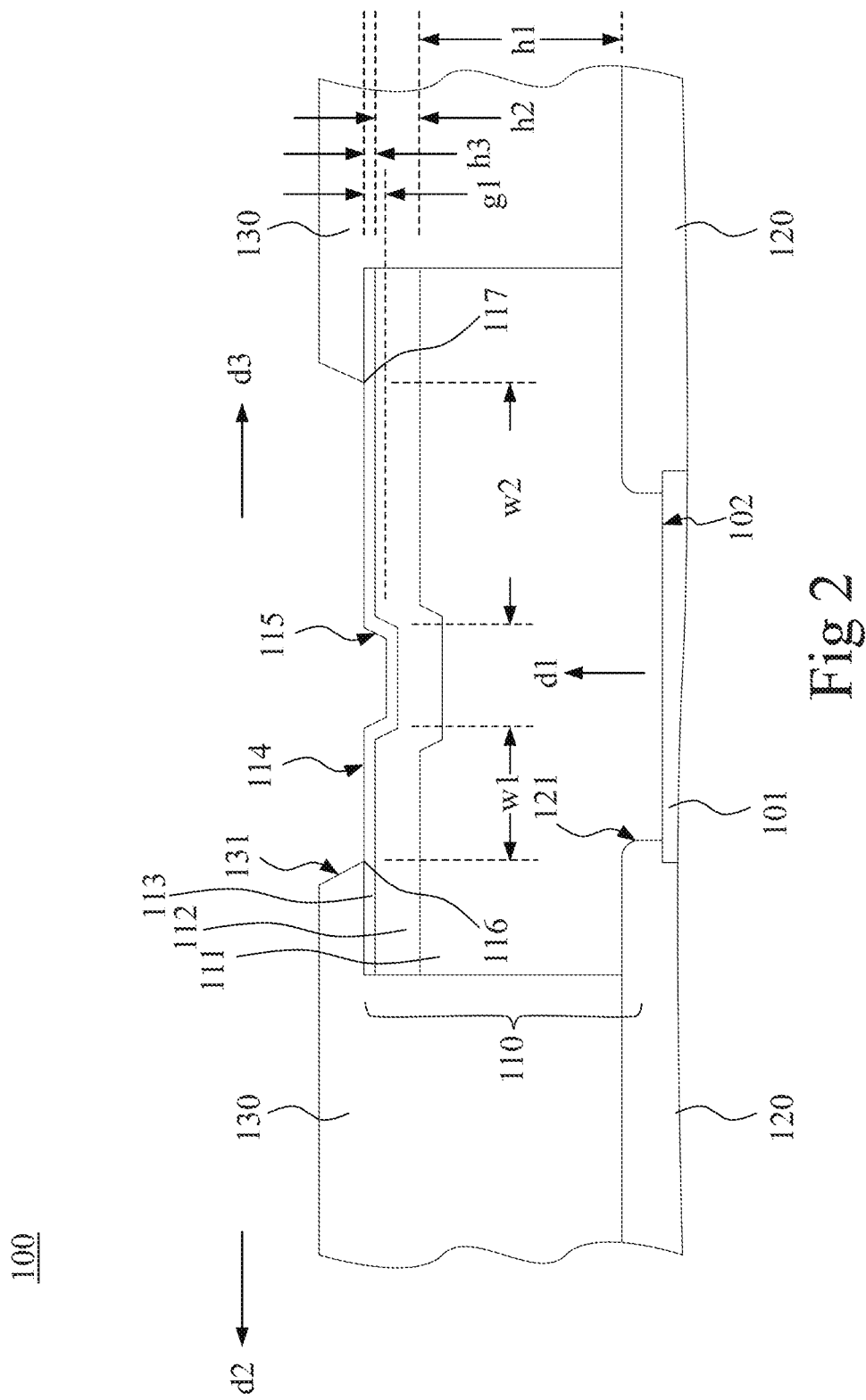
FIG. 2 is a schematic sectional view taken along cutting plan line 2-2 in FIG. 1.

FIG. 2 is a schematic sectional view taken along a cutting plan line 2-2 in FIG. 2. Please refer to FIG. 2, the chip 100 includes a plurality of conductive structures 110, and the chip 100 also includes a plurality of pads 101. The pad 101 has a first connecting surface 102, and the conductive structure 110 is disposed on the first connecting surface 102.

In the embodiment, the conductive structure 110 includes a first metal layer 111, a second metal layer 112, and a third metal layer 113. The first metal layer 111 connects the pad 101, and the second metal layer 112 is located between the first metal layer 111 and the third metal layer 113. Also, on the pad 101, the first metal layer 111, the second metal layer 112, and the third metal layer 113 are stacked along a first direction d1 on the first connecting surface 102 of the pad 101, while the first direction d1 is parallel to a normal direction of the first connecting surface 102. The first metal layer 111 is directly in contact with the second metal layer 112, and the second metal layer 112 is directly in contact with the first metal layer 111 and the third metal layer 113, and the third metal layer 113 is directly in contact with the second metal layer 112 and the pad 101. For instance, the pad 101 of the embodiment can be made of a material including aluminum, but the disclosure is not limited thereto.

Moreover, the second metal layer 112 of the embodiment is made of a material including nickel (Ni). Therefore, the second metal layer 112 of the conductive structure 110 is hard enough to protect the first metal layer 111 and the pad 101 located below.

For example, before the dicing process of the chip 100, a testing system may test the electrical condition of the chip 100 with a probe card, and the conductive structure 110 on the pad 101 may provide a proper electrical conductivity between a needle of the probe card and the chip 100. Also, because of the second metal layer 112, the conductive structure 110 of the chip 100 is hard enough to sustain stabbing of the needle during a testing process. Therefore, the chip 100 of the embodiment has a better durability.

For example, the testing system of the embodiment may include tester or prober, and the tester may be Advantest T5377/T5377S/T5383/T5385/T5503/T5833, or any Advantest T53XX, T55XX, T58XX series, and the prober may be Tokyo Electron Ltd. (TEL) P8/P12/P12+/Precio/PrecioXL, or any TEL PrecioXX series, or Accretech UF3000/UF3000EX, or any Accretech UF3000XX series, but the disclosure is not limited thereto. In other words, in some embodiments of the present disclosure, a correlation wafer may include a plurality of chips 100, and the conductive structures 110 of the chip 100 can sustain stabbing of needles of probe cards from different testing systems, and the correlation wafer has good durability. Also, in some embodiments of the present disclosure, the probe cards of the testing system may include epoxy probe card, vertical probe card, array probe card, multi-DUT probe card, but the present disclosure is not limited thereto.

Moreover, conductive structure 110 has a second connecting surface 114 located on the third metal layer 113, and an area of the second connecting surface 114 is larger than an area of the first connecting surface 102. Therefore, during testing, the conductive structure 110 can offer the needle of the probe card a wider testing area.

For example, the chip 100 may further include a passivation layer 120. The passivation layer 120 is disposed between the conductive structures 110 and the pads 101, and the passivation layer 120 has a plurality of pad openings 121, and the pad openings 121 are corresponded to the first connecting surfaces 102 of the pads 101 respectively. In other words, the pad opening 121 of the passivation layer 120 defines the first connecting surface 102 of the pad 101.

Also, for instance, the chip 100 may further include a second polyimide layer 130. The second polyimide layer 130 is disposed on the conductive structures 110, and the second polyimide layer 130 has a plurality of second openings 131, and the second openings 131 are corresponded to the conductive structures 110 respectively. In other words, each of the second openings 131 is corresponded to one of the conductive structures 110, and every second opening 131 defines the second connecting surface 114 of the third metal layer 113 of the conductive structure 110. An area of the second opening 131 may be larger than an area of the pad opening 121, and, therefore; the area of the second connecting surface 114 can be larger than the area of the first connecting surface 102.

The conductive structure 110 of the embodiment has a depression 115 corresponded to the first connecting surface 102 covered by the conductive structure 110. And, on the first direction d1, a depth g1 of the depression 115 is less than 2 micrometer. The conductive structure 110 form on the pad 101 and the pad opening 121 of the passivation layer 120 in a conformal manner, and, therefore, the depth g1 of the depression 115 can be reduced, and the depression 115 is shallow enough to prevent collision of the needle of the probe card during testing.

Figure 3:
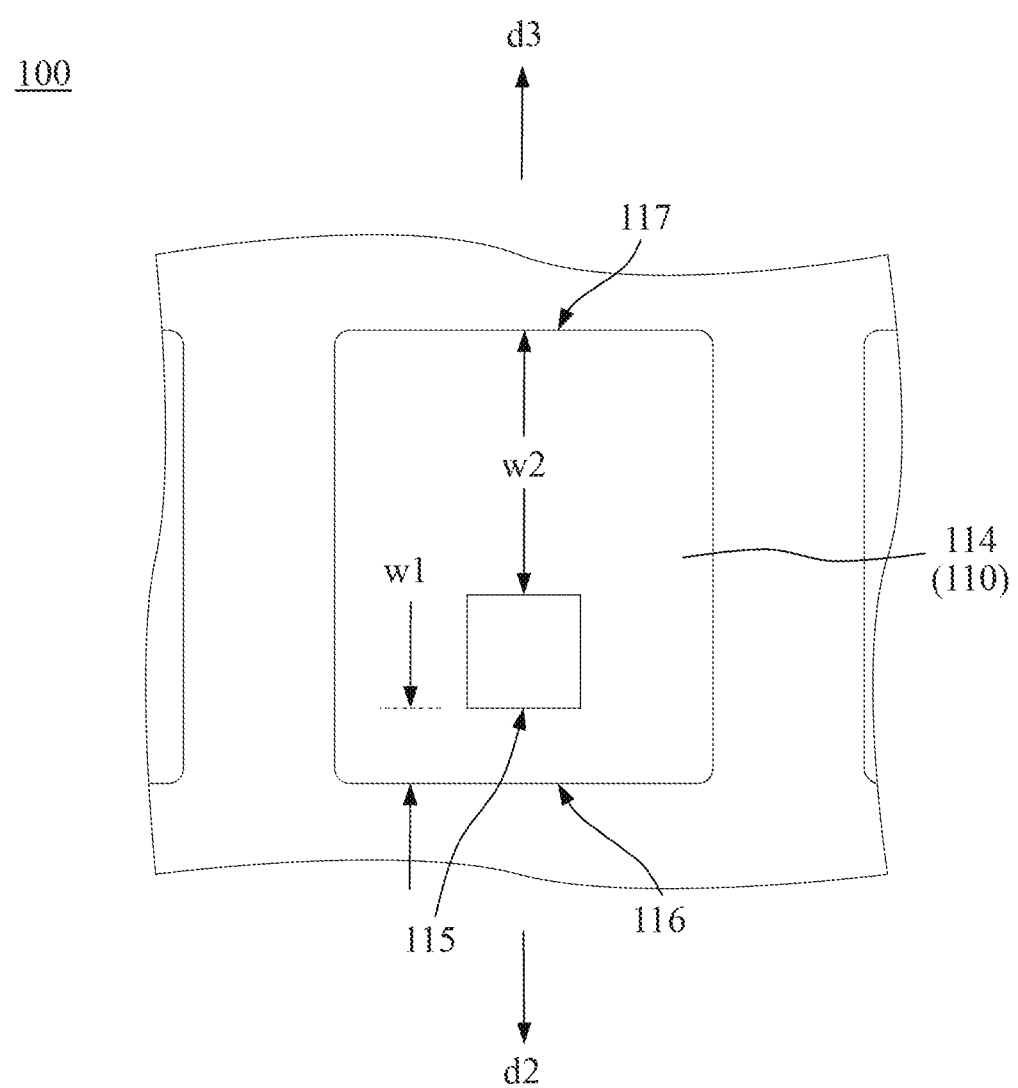
FIG. 3 is an enlarged plane view of area A in FIG. 1.

FIG. 3 is an enlarged plane view of area A in FIG. 1. Please refer FIG. 1 to FIG. 3, in the embodiment, the second connecting surface 114 has an inner edge 116 facing along direction d2, which is facing toward a center of the chip 100, and the second connecting surface 114 has an outer edge 117 facing along direction d3, which is facing toward an edge of the chip 100. Referring to FIG. 2 and FIG. 3, a first distance w1 is between the inner edge 116 and the depression 115, and a second distance w2 is between the outer edge 117 and the depression 115. In the embodiment, the ratio of the first distance w1 to the second distance w2 (w1:w2) is 10:35, but the present disclosure is not limited thereto. In other embodiments of the present disclosure, the ratio of the first distance w1 to the second distance w2 (w1:w2) falls in a range from 2:77 to 10:35. Therefore, in the embodiment, the conductive structure 110 can provide big flat area near the outer edge 117 of the second connecting surface 114, providing a proper touching area for the needle of the probe card.

Furthermore, please refer to FIG. 2, the first metal layer 111 of the conductive structure 110 of the embodiment is made of a material comprising copper, and, therefore; the conductive structure 110 can have proper electrical conductivity.

The third metal layer 113 of the conductive structure 110 of the embodiment is made of a material comprising gold, and, therefore, the third metal layer 113 has proper electrical conductivity, and the third metal layer 113 can be soft enough to protect a tip of the needle of the probe card.

Also, a thickness h1 of the first metal layer 111 is larger than a thickness h2 of the second metal layer 112, and the thickness h2 of the second metal layer 112 is larger than a thickness h3 of the third metal layer 113. For example, the ratio of the thickness h1 to thickness h3 can be 18:4:1, but the present disclosure is not limited thereto.

Since the first metal layer 111 is form on the pad 101 and the pad opening 121 of the passivation layer 120 in conformal manner, and the first metal layer 111 is thick enough to reduce the depth g1 of the depression 115, the conductive structure 110 can provide a proper electrical conductivity and a second connecting surface 114 with the first metal layer 111.

Figure 4:
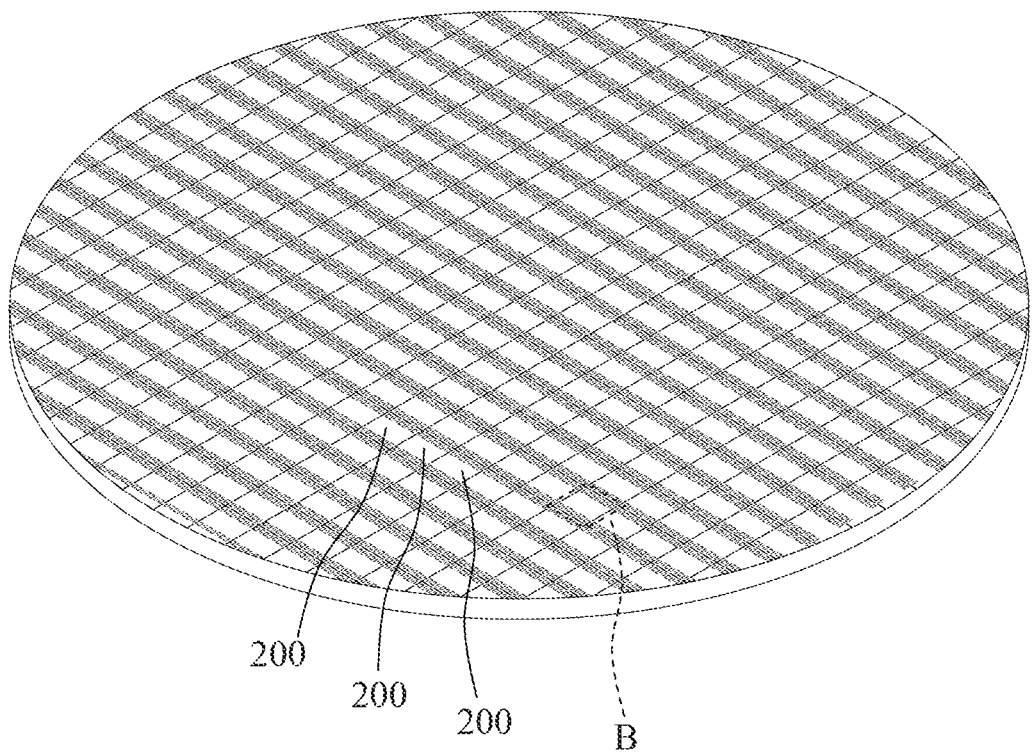
FIG. 4 is a schematic perspective view of a wafer of another embodiment of the present disclosure.

FIG. 4 is a schematic perspective view of a wafer of another embodiment of the present disclosure. Please refer to FIG. 4, in this embodiment, the wafer 203 includes a plurality of chips 200, and the chips 200 are arranged on the wafer 203 and connected to each other.

Figure 5:
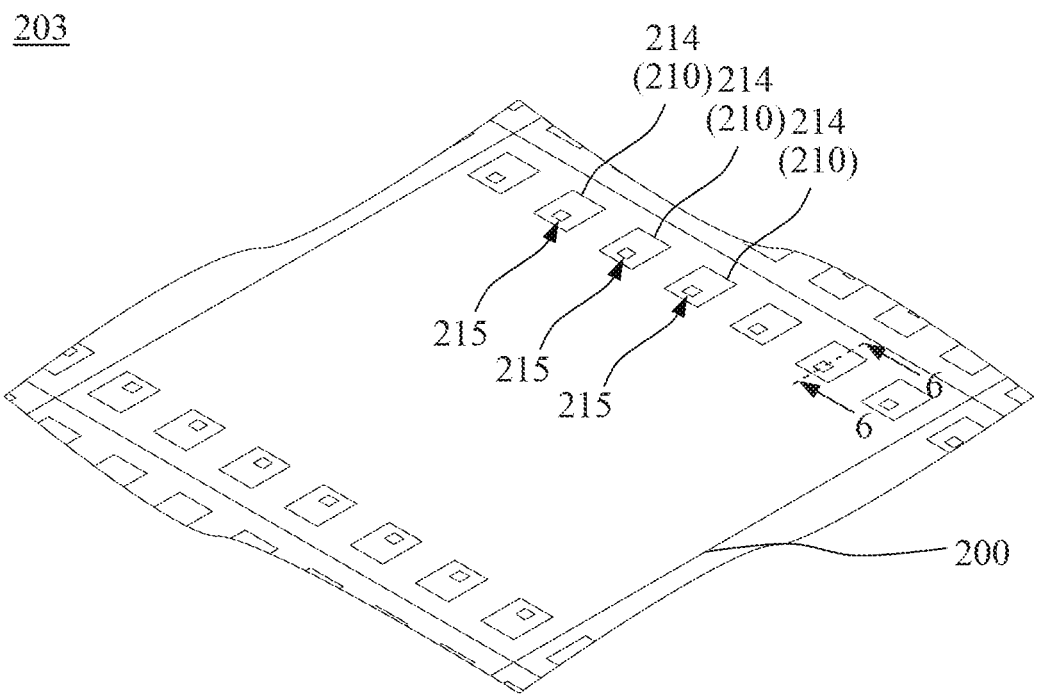
FIG. 5 is an enlarged plane view of area B in FIG. 4.

FIG. 5 is an enlarged plane view of area B in FIG. 4. Please refer to FIG. 5, the chip 200 includes a plurality of conductive structures 210, and each of the conductive structures 210 has a second connecting surface 214, and the second connecting surface 214 has a depression 215.

However, the disclosure is not limited to the arrangement of the conductive structures 210 of the chip 200 of the embodiment. In some embodiments of the present disclosure, the conductive structures 210 can be lined up in two or more rows at the edges of the chip 200. Also, in some embodiment of the present disclosure, the conductive structures 210 of the chip 200 can arranged with their short sides or long sides facing each other.

Moreover, the conductive structures 210 of the chip 200 of the embodiment can be tested by needles of a probe card, while the needles of the probe card are extended along the same direction, but the present disclosure is not limited thereto. In some embodiment, the probe card testing the chip 200 may include needles extended along opposite direction and arranged in an alternative manner.

Figure 6:
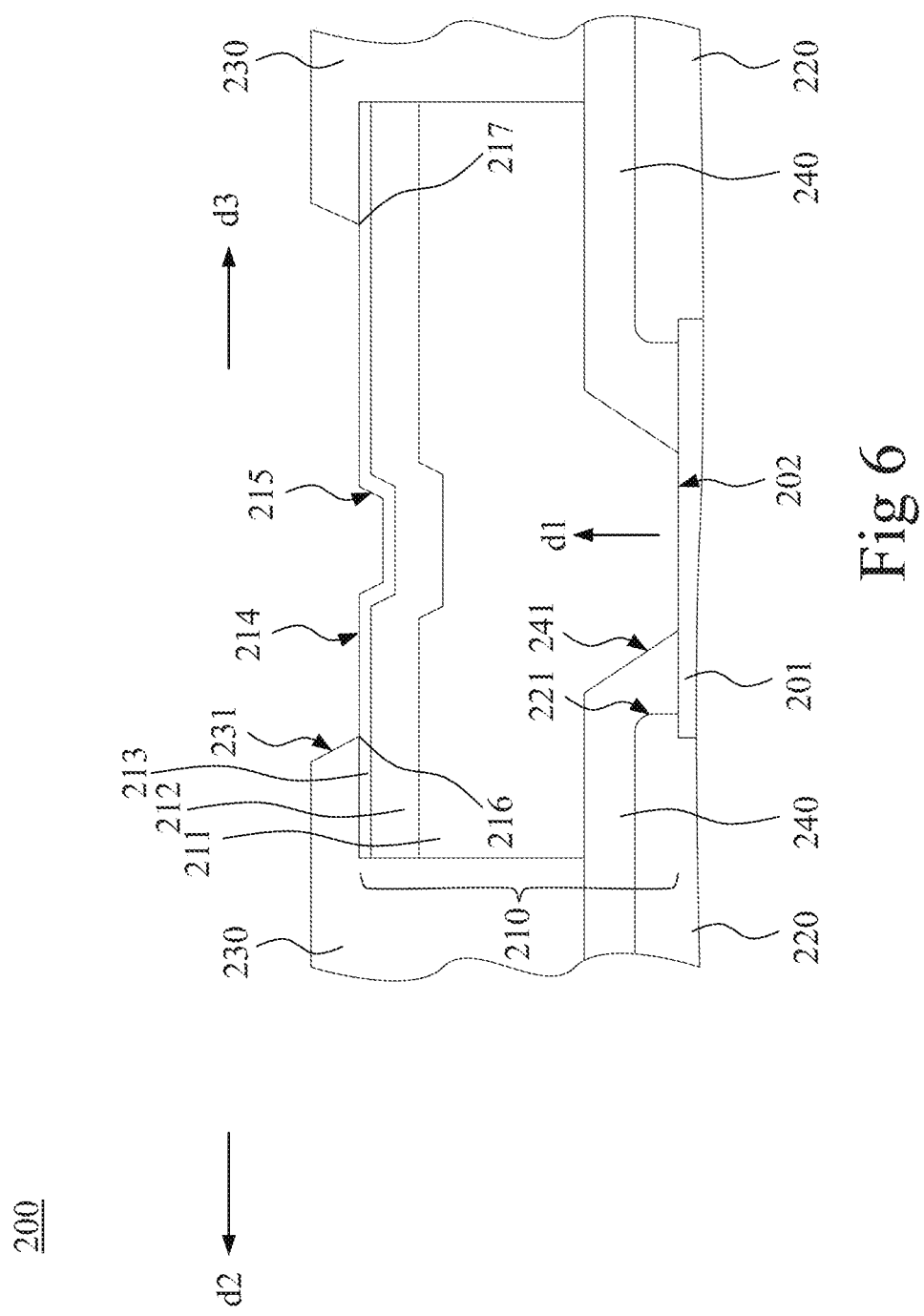
FIG. 6 is a schematic sectional view taken along cutting plane line 6-6 in FIG. 5.

FIG. 6 is a schematic section view taken along cutting plane line 6-6 in FIG. 5. Please refer to FIG. 6, the chip 200 of the embodiment is similar to the chip 100 of the above embodiment, and identical components and detailed descriptions are not repeated here. Each of the chips 200 includes pad 201 having first connecting surface 202, and a conductive structure 210 is disposed on the first connecting surface 202. Also, each of the conductive structures 210 includes a first metal layer 211, a second metal layer 212, and a third metal layer 213, and the first metal layer 211, the second metal layer 212, and the third metal layer 213 are stacked along a first direction d1, which is parallel to a normal direction of the first connecting surface 202.

Each of the chips 200 further includes a passivation layer 220, a first polyimide layer 240, and a second polyimide layer 230. The passivation layer is disposed between the conductive structure 210 and the pad 201, and the first polyimide layer is disposed between the passivation layer 220 and the conductive structure 210, and the second polyimide layer is disposed on the conductive structure 210.

The passivation layer 220 includes pad openings 221, and the pad openings 221 are corresponded to the first connecting surfaces 202 of the pads 201 respectively. The first polyimide layer 240 includes a plurality of first openings 241, and each of the first openings 241 is located above one of the pad openings 221. The second polyimide layer 230 includes second openings 231, and each of the second openings 231 is corresponded to one of the conductive structures 210.

In the embodiment, the first connecting surface 202 of the pad 201 is defined by the first opening 241 of the first polyimide layer 240, and the second connecting surface 214 of the conductive structure 210 is defined by the second opening 231 of the second polyimide layer 230.

For example, the pads 201, the passivation layer 220, and the first polyimide layer 240 may be manufacture at first, and the conductive structures 210 and the second polyimide layer 230 can be further disposed on the first polyimide layer 240 and the first connecting surface 202. Therefore, the conductive structures 210 can be further disposed on the pad 201, so as to provide a proper protection to pad 201.

The first metal layer 211 covers the first opening 241 of the first polyimide layer 240 in a conformal manner, and width and depth of the depression 215 can be further reduced. Also, the second connecting surface 214 has an outer edge 217 facing along a direction d3, which is facing toward an edge of the chip 200, and the second connecting surface 214 has an inner edge 216 facing along a direction d2, which is facing toward a center of the chip 200.

In the embodiment, a distance between the depression 215 and the outer edge 217 is longer than a distance between the depression 215 and the inner edge 216. Therefore, the second connecting surface 214 of the conductive structure 210 can provide a proper area for a needle of a probe card during testing.

Figure 7:
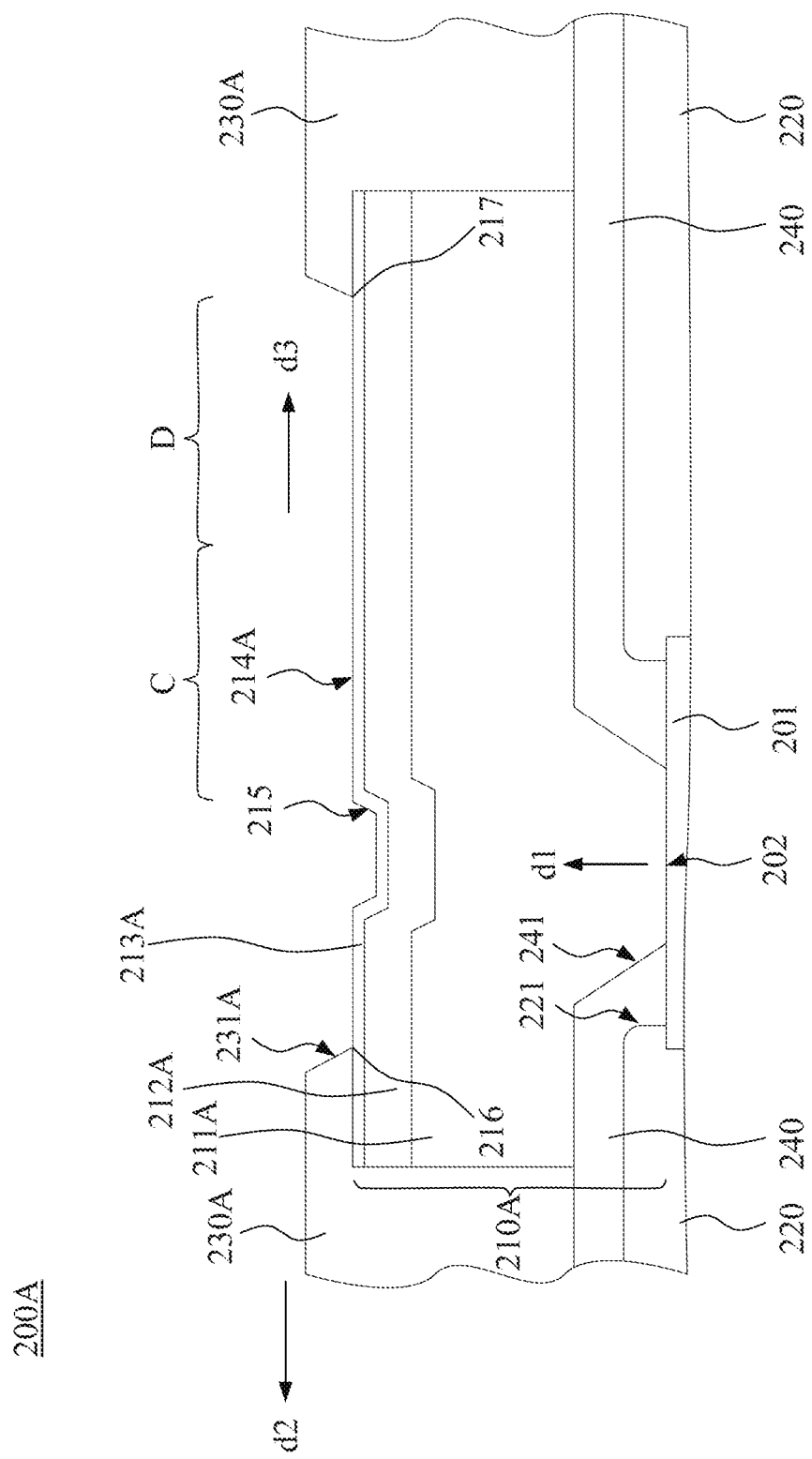
FIG. 7 is a schematic sectional view of chip of still another embodiment of present disclosure.

FIG. 7 is schematic sectional view of chip of still another embodiment of present disclosure. Please refer to FIG. 7, the chip 200A is similar to the chip 200 of the above embodiment, and identical components and detailed descriptions are not repeated here.

The conductive structure 210A has a first metal layer 211A, a second metal layer 212A, and third metal layer 213A, and the second opening 231A of the second polyimide layer 230A defines a second connecting surface 214A. In the embodiment, the second connecting surface 214A has a first connecting area C and a second connecting area D located between the depression 215 and the outer edge 217.

For example, while the chips 200A is located on a correlation wafer, the first connecting area C of the second connecting surface 214A can provide a proper area for a needle of a probe card of a testing system running a normal test, and the second connecting area D of the second connecting surface 214A can provide another proper area for a needle of a probe card of another testing system running a redistribution layer (RDL) test. On the direction d3, a width of the first connecting area C and a width of the second connecting area D are the same, and the width of the first connecting area C can be larger than 35 micrometer, and the width of the second connecting area D can be larger than 35 micrometer.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A chip, comprising:
   a plurality of pads comprising first connecting surfaces respectively;
   a plurality of conductive structures being disposed on the first connecting surfaces respectively,
   wherein each of the conductive structures comprises:
      a first metal layer connecting one of the pads;
      a third metal layer; and
      a second metal layer being disposed between the first metal layer and the third metal layer,
   and, on each of the pads, the first metal layer, the second metal layer, and the third metal layer are stacked along a first direction on the first connecting surface of the pad, and the first direction is parallel to a normal direction of the first connecting surface, and the first metal layer is made of a material comprising gold, and the second metal layer is made of a material comprising nickel;
   a passivation layer, being disposed between the conductive structures and the pads;
   a first polyimide layer, being disposed between the passivation layer and the conductive structures; and
   a second polyimide layer, being disposed on the conductive structures,
   wherein the passivation layer comprises a plurality of pad openings, and the pad openings are corresponded to the first connecting surfaces of the pads respectively, and the first polyimide layer comprises a plurality of first openings, and each of the first openings is located above one of the pad openings, and the second polyimide layer comprises a plurality of second openings, and each of the second openings is corresponded to one of the conductive structures.

2. The chip of claim 1, wherein each of the conductive structures comprises a depression corresponded to the first connecting surface covered by the conductive structure, and, on the first direction, a depth of the depression is less than 2 micrometer.

3. The chip of claim 2, wherein each of the conductive structures comprises a second connecting surface located on the third metal layer, and the second connecting surface comprises an inner edge and an outer edge, and the inner edge of the second connecting surface is facing toward a center of the chip, and the outer edge of the second connecting surface is facing toward an edge of the chip, and a first distance is between the inner edge and the depression, and a second distance is between the outer edge and the depression, and a ratio of the first distance to the second distance falls in a range from 2:77 to 10:35.

4. The chip of claim 2, wherein each of the conductive structures comprises a second connecting surface located on the third metal layer, and the second connecting surface comprises an inner edge, a first connecting area, a second connecting area, and an outer edge, and the inner edge of the second connecting surface is facing toward a center of the chip, and the outer edge of the second connecting surface is facing toward an edge of the chip, and the first connecting area is disposed between the depression and the second connecting area, and the second connecting area is disposed between the first connecting area and the outer edge, and, on a direction facing toward the edge of the chip, a width of the first connecting area is larger than 35 micrometer, and a width of the second connecting area is larger than 35 micrometer.

5. The chip of claim 1, wherein each of the conductive structures comprises a second connecting surface located on the third metal layer, and an area of the second connecting surface is larger than an area of the first connecting surface of the pad, which is disposed below the conductive structure.

6. The chip of claim 1, wherein the first metal layer is made of a material comprising copper.

7. The chip of claim 1, wherein, on the first direction, a thickness of the first metal layer is larger than a thickness of the second metal layer, and the thickness of the second metal layer is larger than a thickness of the third metal layer.

8. A wafer, comprising:
   a plurality of chips, wherein each of the chips comprises:
   a plurality of pads comprising first connecting surface respectively; and
   a plurality of conductive structures being disposed on first connecting surfaces respectively,
   wherein, in each of the chips, each of the conductive structures comprises:
      a first metal layer connecting one of the pads;
      a third metal layer; and
      a second metal layer being disposed between the first metal layer and the third metal layer,
   and, on each of the pads, the first metal layer, the second metal layer, and the third metal layer are stacked along a first direction on the first connecting surface of the pad, and the first direction is parallel to a normal direction of the first connecting surface, and the first metal layer is made of a material comprising gold, and the second metal layer is made of a material comprising nickel;
   a passivation layer, being disposed between the conductive structures and the pads;
   a first polyimide layer, being disposed between the passivation layer and the conductive structures; and
   a second polyimide layer, being disposed on the conductive structures,
   wherein the passivation layer comprises a plurality of pad openings, and the pad openings are corresponded to the first connecting surfaces of the pads respectively, and the first polyimide layer comprises a plurality of first openings, and each of the first openings is located above one of the pad openings, and the second polyimide layer comprises a plurality of second openings, and each of the second openings is corresponded to one of the conductive structures.

9. The wafer of claim 8, wherein each of the conductive structures comprises a depression corresponded to the first connecting surface covered by the conductive structures, and, on the first direction, a depth of the depression is less than 2 micrometer.

10. The wafer of claim 9, wherein each of the conductive structures comprises a second connecting surface located on the third metal layer, and the second connecting surface comprises an inner edge and an outer edge, and, in each of the chip, the inner edge of the second connecting surface of each of the conductive structures is facing toward a center of the chip, and the outer edge of the second connecting surface is facing toward an edge of the chip, and a first distance is between the inner edge and the depression, and a second distance is between the outer edge and the depression, and a ratio of the first distance to the second distance falls in a range from 2:77 to 10:35.

11. The wafer of claim 9, wherein each of the conductive structures comprises a second connecting surface located on the third metal layer, and the second connecting surface comprises an inner edge, a first connecting area, a second connecting area, and an outer edge, and the inner edge of the second connecting surface is facing toward a center of the chip, and the outer edge of the second connecting surface is facing toward an edge of the chip, and the first connecting area is disposed between the depression and the second connecting area, and the second connecting area is disposed between the first connecting area and the outer edge, and, on a direction facing toward the edge of the chip, a width of the first connecting area is larger than 35 micrometer, and a width of the second connecting area is larger than 35 micrometer.

12. The wafer of claim 8, wherein each of the conducive structures comprises a second connecting surface located on the third metal layer, and an area of the second connecting surface is larger than an area of the first connecting surface of the pad, which is disposed below the conductive structure.

13. The wafer of claim 8, wherein the first metal layer is made of a material comprising copper.

14. The wafer of claim 8, wherein, in each of the chips, on the first direction, a thickness of the first metal layer is larger than a thickness of the second metal layer, and the thickness of the second metal layer is larger than a thickness of the third metal layer.

* * * * *